(12) United States Patent
Hamazono

(10) Patent No.: US 11,962,284 B2
(45) Date of Patent: Apr. 16, 2024

(54) COMPOSITE SUBSTRATE

(71) Applicant: KYOCERA Corporation, Kyoto (JP)

(72) Inventor: Koji Hamazono, Satsumasendai (JP)

(73) Assignee: KYOCERA CORPORATION, Kyoto (JP)

(*) Notice: Subject to any disclaimer, the term of this patent is extended or adjusted under 35 U.S.C. 154(b) by 423 days.

(21) Appl. No.: 17/258,053

(22) PCT Filed: Jul. 29, 2019

(86) PCT No.: PCT/JP2019/029644
§ 371 (c)(1),
(2) Date: Jan. 5, 2021

(87) PCT Pub. No.: WO2020/027048
PCT Pub. Date: Feb. 6, 2020

(65) Prior Publication Data
US 2021/0167749 A1   Jun. 3, 2021

(30) Foreign Application Priority Data

Jul. 30, 2018 (JP) .................................. 2018-142596

(51) Int. Cl.
*H03H 9/02* (2006.01)

(52) U.S. Cl.
CPC .... *H03H 9/02574* (2013.01); *H03H 9/02559* (2013.01); *H03H 9/02834* (2013.01); *H03H 9/02897* (2013.01)

(58) Field of Classification Search
CPC .......... H03H 9/02574; H03H 9/02559; H03H 9/02834; H03H 9/02897; H01L 41/053

USPC ...... 310/313 R, 313 A, 313 B, 313 C, 313 D
See application file for complete search history.

(56) References Cited

U.S. PATENT DOCUMENTS

| | | | |
|---|---|---|---|
| 9,927,349 B2 | 3/2018 | Wang et al. | |
| 10,250,223 B2 | 4/2019 | Kurihara et al. | |
| 10,673,409 B2 | 6/2020 | Umehara et al. | |
| 2010/0052473 A1* | 3/2010 | Kimura | H03H 9/059 29/25.35 |
| 2017/0272051 A1* | 9/2017 | Kurihara | H03H 9/6483 |
| 2017/0324398 A1 | 11/2017 | Umehara et al. | |

FOREIGN PATENT DOCUMENTS

| | | |
|---|---|---|
| CN | 104571681 A | 4/2015 |
| CN | 107004641 A | 8/2017 |
| JP | 2000-277457 A | 10/2000 |
| JP | 2013-156102 A | 8/2013 |

(Continued)

*Primary Examiner* — Derek J Rosenau
(74) *Attorney, Agent, or Firm* — Procopio, Cory, Hargreaves & Savitch LLP

(57) ABSTRACT

A composite substrate is a plate-shaped body where a first substrate and a second substrate overlap. The composite substrate includes a hole in the first substrate and the second substrate in a thickness direction of the plate-shaped body. A ratio A/B of an average thickness A of the first substrate to an average thickness B of the second substrate is ⅕ or less. An interface between the first substrate and the second substrate on an inner wall of the plate-shaped body that is positioned at the hole includes a part that is covered by a covering layer that contains a component that composes the second substrate.

13 Claims, 1 Drawing Sheet

(56) References Cited

FOREIGN PATENT DOCUMENTS

| | | |
|---|---|---|
| JP | 2013-165100 A | 8/2013 |
| JP | 2017-112155 A | 6/2017 |
| JP | 2017-169139 A | 9/2017 |
| WO | 2016/084936 A1 | 6/2016 |

* cited by examiner

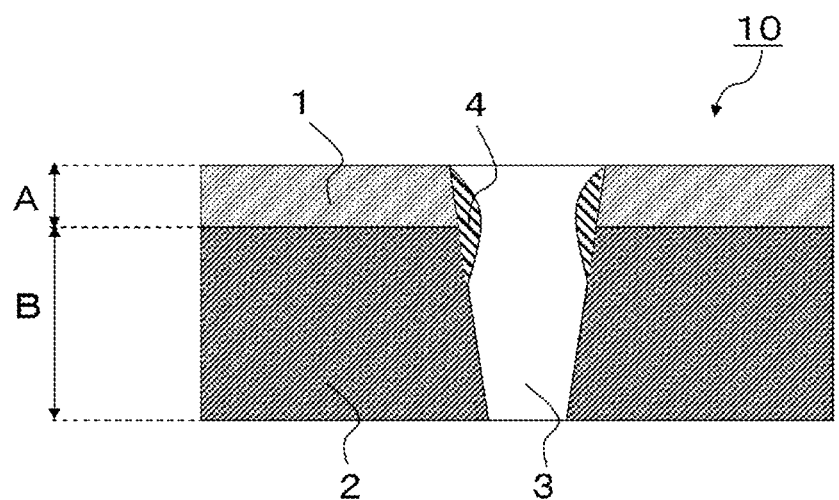

COMPOSITE SUBSTRATE

CROSS-REFERENCE TO RELATED APPLICATION(S)

This application is a national stage application of International Application No. PCT/JP2019/029644 filed on Jul. 29, 2019, which designates the United States, the entire contents of which are herein incorporated by reference, and which is based upon and claims the benefit of priority to Japanese Patent Application No. 2018-142596 filed on Jul. 30, 2018, the entire contents of which are herein incorporated by reference.

FIELD

The present disclosure relates to a composite substrate.

BACKGROUND

In recent years, thinning of a piezoelectric element such as an SAW (surface acoustic wave) element that is used for a communication device such as a mobile phone is demanded.

Accordingly, for example, Patent Literature 1 proposes an SAW device that positions an LT ($LiTaO_3$) substrate on a surface of a sapphire substrate and includes a via conductor that is positioned at a hole that is communicated with such a sapphire substrate and a LT substrate.

Thus, Patent Literature 1 does not provide an LT substrate as a single body but also uses a sapphire substrate with a mechanical strength that is higher than that of the LT substrate, so that it is possible to maintain an overall mechanical strength and thin the LT substrate, and thinning of a SAW device is realized.

CITATION LIST

Patent Literature

Patent Literature 1: International Publication No. 2016/084936

SUMMARY

A composite substrate according to the present disclosure is a plate-shaped body where a first substrate and a second substrate overlap. Furthermore, it has a hole in the first substrate and the second substrate in a thickness direction of the plate-shaped body. Furthermore, a ratio A/B of an average thickness A of the first substrate to an average thickness B of the second substrate is ⅕ or less. Furthermore, an interface between the first substrate and the second substrate on an inner wall of the plate-shaped body that is positioned at the hole has a part that is covered by a covering layer that contains a component that composes the second substrate.

BRIEF DESCRIPTION OF DRAWINGS

FIG. 1 is a cross-sectional diagram that illustrates an example of a composite substrate according to the present disclosure.

DESCRIPTION OF EMBODIMENTS

A composite substrate according to the present disclosure will be explained with reference to the drawings.

As illustrated in FIG. 1, a composite substrate 10 according to the present disclosure has a first substrate 1 and a second substrate 2. The composite substrate 10 is a plate-shaped body.

As illustrated in FIG. 1, in the composite substrate 10 according to the present disclosure, the first substrate 1 and the second substrate 2 overlap.

Herein, the first substrate 1 is a substrate that has a piezoelectric performance, and is, for example, a lithium tantalate ($LiTaO_3$ that will be described as LT below) substrate, a lithium niobate ($LiNbO_3$ that will be described as LN below) substrate, or the like. On the other hand, the second substrate 2 is a silicon substrate or a sapphire substrate if it is of a single crystal or an aluminum oxide substrate, an aluminum nitride substrate, or a silicon nitride substrate if it is of a poly crystal, or the like, and has a mechanical strength that is higher than that of the first substrate 1.

Additionally, it is possible to specify a material that composes the first substrate 1 and the second substrate 2 by using an X-ray diffractometer (XRD) so as to execute measurement thereof and identifying a value of an obtained 2θ (where 2θ is an diffraction angle) in a JCPDS card.

Then, as illustrated in FIG. 1, the composite substrate 10 according to the present disclosure has a hole 3 in the first substrate 1 and the second substrate 2 in a thickness direction of a plate-shaped body thereof, and a ratio A/B of an average thickness A of the first substrate 1 to an average thickness B of the second substrate 2 is ⅕ or less. Moreover, an interface between the first substrate 1 and the second substrate 2 on an inner wall of a plate-shaped body that is positioned at the hole 3 has a part that is covered by a covering layer 4 that contains a component that composes the second substrate 2.

As such a configuration is satisfied, an interface that is positioned at the hole 3 is covered by the covering layer 4 that contains a component that composes the second substrate 2 that is excellent in a mechanical strength even if a thickness of the composite substrate 10 is small, so that a crack is prevented from being readily generated from an interface that is positioned at the hole 3 in the composite substrate 10 according to the present disclosure.

Herein, from a viewpoint of improving of a mechanical strength of a composite substrate, a ratio A/B of an average thickness A of the first substrate 1 to an average thickness B of the second substrate 2 may be 1/50 or greater. Additionally, an average thickness A of the first substrate 1 may be, for example, 1 μm or greater and 40 μm or less. Furthermore, an average thickness B of the second substrate 2 may be, for example, 50 μm or greater and 200 μm or less.

Additionally, it is sufficient that an average thickness A of the first substrate 1 and an average thickness B of the second substrate are measured and calculated by a following method. First, the composite substrate 10 is cut so as to provide a cross section as illustrated in FIG. 1 and is polished by a cross section polisher (CP). Then, a photograph of such a polished cross section is taken by using a scanning electron microscope (SEM). Then, it is sufficient that thicknesses of each of the first substrate 1 and the second substrate 2 at, at least, 5 or more places in a taken photograph are measured and an average value thereof is calculated.

Furthermore, in the covering layer 4, a content of a component that composes the second substrate 2 is 90% by mass or greater of 100% by mass of all components that compose the covering layer 4. Herein, it is sufficient that a component that composes the covering layer 4 and a content thereof is confirmed by a following method. First, the composite substrate 10 is cut so as to provide a cross section as illustrated in FIG. 1 and is polished by a CP. Then, it is sufficient that the covering layer 4 in such a polished cross section is measured by using an energy dispersive X-ray analyzer (EDS) equipped with an SEM or a transmission electron microscope (TEM) and a component that composes the covering layer 4 and a content thereof are calculated.

Furthermore, the covering layer 4 in the composite substrate 10 according to present disclosure may be positioned so as to surround an interface between the first substrate 1 and the second substrate 2. Herein, the covering layer 4 being positioned so as to surround an interface means that a whole of an interface is covered by the covering layer 4 and a place with an exposed interface is absent at the hole 3. If such a configuration is satisfied, a whole of an interface is covered by the covering layer 4, so that a crack is further prevented from being readily generated from an interface that is positioned at the hole 3 in the composite substrate 10 according to the present disclosure. Furthermore, in a case where the composite substrate 10 is cleaned by a cleaning agent such as an alkaline solution before a via conductor is formed at the hole 3, the cleaning agent does not penetrate into an interface and it is possible to maintain adhesion between the first substrate 1 and the second substrate 2, so that it is excellent in reliability.

Furthermore, in the composite substrate 10 according to the present disclosure, the covering layer 4 may be positioned at 90% or greater of a thickness from an interface to an opening of the first substrate 1, on an inner wall of the first substrate 1 that is positioned at the hole 3. Herein, the covering layer 4 being positioned at 90% or greater of a thickness from an interface to an opening of the first substrate 1 means that, when A is a distance from an interface to an opening of the first substrate 1, the covering layer 4 covers an interface to a part at 0.9A or greater toward a side of the opening, on an inner wall of the first substrate 1 that is positioned at the hole 3.

Then, if such a configuration is satisfied, the covering layer 4 protects the first substrate 1 with a less mechanical strength from thermal stress that is caused by a via conductor when the via conductor is formed at the hole 3, so that a crack is prevented from being readily generated in the first substrate 1. Additionally, from a viewpoint of preventing of a crack from being readily generated by the first substrate 1, the covering layer 4 may cover a whole of an inner wall of the first substrate 1 that is positioned at the hole 3.

Furthermore, the covering layer 4 in the composite substrate 10 according to the present disclosure may have a part with a thickness that gradually increases from a side of an opening to a side of an interface of the first substrate 1. If such a configuration is satisfied, it is possible for a place that covers an interface on the covering layer 4 to efficiently relax thermal stress that is caused by a via conductor, so that a crack is further prevented from being readily generated from an interface that is positioned at the hole 3 in the composite substrate 10 according to the present disclosure.

Furthermore, the covering layer 4 in the composite substrate 10 according to the present disclosure may have a part with a thickness that gradually increases from a side of an opening to a side of an interface of the second substrate 2. If such a configuration is satisfied, it is possible for a place that covers an interface on the covering layer 4 to efficiently relax thermal stress that is caused by a via conductor, so that a crack is further prevented from being readily generated from an interface that is positioned at the hole 3 in the composite substrate 10 according to the present disclosure.

Herein, a maximum thickness of the covering layer 4 may be, for example, 0.5 μm or greater and 2.5 μm or less. If the covering layer 4 is of a maximum thickness as described above, formation of a via conductor at the hole 3 is facilitated and it is possible for the covering layer 4 to protect an interface efficiently.

Furthermore, as illustrated in FIG. 1, for the hole 3 in the composite substrate 10 according to the present disclosure, a size of an opening of the first substrate 1 may be greater than a size of an opening of the second substrate 2. If such a configuration is satisfied, it is possible to cause a current to flow through the first substrate 1 via a via conductor at the hole 3 efficiently, so that an electrical characteristic of the composite substrate 10 according to the present disclosure is improved.

Furthermore, a size of an opening of the first substrate 1 at the hole 3 may be, for example, of a circular shape with a diameter of 40 μm or greater and 90 μm or less. On the other hand, a size of an opening of the second substrate 2 at the hole 3 may be, for example, of a circular shape with a diameter of 30 μm or greater and 70 μm or less.

Furthermore, a surface roughness of an inner wall of the first substrate 1 may be greater than a surface roughness of an inner wall of the second substrate 2. In other words, a surface roughness of an inner wall of the second substrate 2 may be less than a surface roughness of an inner wall of the first substrate 1.

In a case where a surface roughness of an inner wall of the first substrate 1 is greater than a surface roughness of an inner wall of the second substrate 2, the covering layer 4 readily tightly adheres to the inner wall of the first substrate 1. Hence, it is possible for the covering layer 4 to cover an interface stably.

On the other hand, in a case where a surface roughness of an inner wall of the second substrate 2 is less than a surface roughness of an inner wall of the first substrate 1, a metal member is readily formed on a whole of an inner wall of the second substrate 2 in a step of forming a metal member that is represented by a via conductor on an inner wall of the first substrate 1 and the inner wall of the second substrate 2 by vapor deposition or sputtering. In particular, a metal member is also readily formed at a part that is distant from an interface on the second substrate 2.

A surface roughness of an inner wall of the first substrate 1 and a surface roughness of an inner wall of the second substrate 2 are parameters of a ten-point average roughness in conformity with JISB0601:2013 appendix JA.

Specifically, a sum of an average of a highest peak to a height of a 5th peak in order of a height and an average of a deepest valley to a depth of a 5th valley in order of a depth is represented.

A surface roughness of an inner wall of the first substrate 1 and a surface roughness of an inner wall of the second substrate 2 are not limited to particular values. For example, it is possible to set a surface roughness of an inner wall of the first substrate 1 at approximately 3 to 7 μm. Furthermore, it is possible to set a surface roughness of an inner wall of the second substrate 2 at approximately 1 to 5 μm.

A specific calculation method for a surface roughness of an inner wall of the first substrate 1 is as follows. The composite substrate 10 is cut so as to provide a cross section as illustrated in FIG. 1 and the cross section is polished by a CP. Then, a photograph of a cross section is taken by using an SEM. Herein, an imaginary line is drawn so as to pass between a highest peak and a deepest valley of irregularities on a cross section while a reference length is provided as 10 μm. Then, a highest peak to 5th one in order of a height are selected and a height or distance of each peak from an imaginary line is measured. Then, an average value of heights or distances of 5 peaks is obtained. Similarly, a deepest valley to 5th one in order of a depth are selected and a depth or distance of each valley from an imaginary line is measured. An average value of depths or distances of 5 valleys is obtained. A sum of an average value of peak heights and an average value of valley depths is obtained.

A specific calculation method for a surface roughness of an inner wall of the second substrate 2 is as follows. The composite substrate 10 is cut so as to provide a cross section as illustrated in FIG. 1 and the cross section is polished by a CP. Then, a photograph of a cross section is taken by using an SEM. Herein, an imaginary line is drawn so as to pass between a highest peak and a deepest valley of irregularities on a cross section while a reference length is provided as 10 μm. Then, a highest peak to 5th one in order of a height are selected and a height or distance of each peak from an imaginary line is measured. Then, an average value of heights or distances of 5 peaks is obtained. Similarly, a deepest valley to 5th one in order of a depth are selected and a depth or distance of each valley from an imaginary line is measured. An average value of depths or distances of 5 valleys is obtained. A sum of an average value of peak heights and an average value of valley depths is obtained.

Next, an example of a manufacturing method for a composite substrate 10 according to the present disclosure will be explained.

First, an LT substrate or an LN substrate is prepared as a first substrate 1. Furthermore, a silicon substrate, a sapphire substrate, an aluminum oxide substrate, an aluminum nitride substrate, or a silicon nitride substrate is prepared as a second substrate 2. Herein, the first substrate 1 is prepared so as to have a thickness in such a manner that a ratio A/B of an average thickness A of the first substrate 1 to an average thickness B of the second substrate 2 is ⅕ or less.

Then, the first substrate 1 and the second substrate 2 are bonded so as to obtain a plate-shaped body where the first substrate 1 and the second substrate 2 overlap. Such bonding is executed by direct joining that does not use an adhesive material or adhesion that uses an adhesive material. Herein, in a case of direct joining, after the second substrate 2 directly overlaps on the first substrate 1, heating or pressurizing thereof is executed in a vacuum, in an air atmosphere, or in a predetermined atmosphere, so that the first substrate 1 and the second substrate 2 are bonded.

Then, a hole 3 that penetrates through the first substrate 1 and the second substrate 2 in a thickness direction of a plate-shaped body is formed by irradiating them with ultrashort pulsed laser that utilizes a third harmonic (355 nm) such as YAG laser from a side of the first substrate 1.

Thus, if ultrashort pulsed laser is used, it is possible to form the hole 3 without generating a crack on the first substrate 1 and the second substrate 2. Then, an output of ultrashort pulsed laser and a processing route are adjusted and a pulse fluence (an energy per unit area that is irradiated with 1 pulse of laser) is increased, so that a component that scatters from a processing region of the second substrate 2 adheres to an inner wall of a plate-shaped body that is positioned at the hole 3 so as to provide a covering layer 4, and a value of the pulse fluence is controlled, so that it is possible to form the covering layer 4 with an any thickness at any place on the inner wall of a plate-shaped body that is positioned at the hole 3.

Thus, an output of ultrashort pulsed laser and a processing route are adjusted so as to firm the hole 3, so that it is possible to obtain the composite substrate 10 according to the present disclosure.

Furthermore, a control method for a surface roughness of an inner wall of a first substrate 1 and a surface roughness of an inner wall of a second substrate 2 will be described. A value of a pulse fluence of laser is adjusted, so that a surface roughness of an inner wall of the first substrate 1 and a surface roughness of an inner wall of the second substrate 2 are controlled. As a value of a pulse fluence of laser is set so as to be high, it is possible to increase a roughness thereof.

Although an embodiment(s) according to the present disclosure has/have been explained above, the present disclosure is not limited to an embodiment(s) as described above and various improvements and modifications thereof may be executed without departing from a spirit of the present disclosure.

REFERENCE SIGNS LIST

1: first substrate
2: second substrate
3: hole
4: covering layer
10: composite substrate

The invention claimed is:

1. A composite substrate comprising:
a plate-shaped body including a first substrate and a second substrate, wherein the first substrate and the second substrate overlap;
a hole in the first substrate and the second substrate in a thickness direction of the plateshaped body;
wherein a ratio A/B of an average thickness A of the first substrate to an average thickness B of the second substrate is ⅕ or less;
wherein an interface between the first substrate and the second substrate on an inner wall of the plate-shaped body that is positioned at the hole includes a part that is covered by a covering layer that contains a component that composes the second substrate; and
wherein a surface roughness of an inner wall of the first substrate is greater than a surface roughness of an inner wall of the second substrate.

2. A composite substrate comprising:
a plate-shaped body including a first substrate made of a first material, the first substrate having a first surface and a second surface;
a second substrate made of a second material, the second substrate having a first surface and a second surface, where the first substrate and the second substrate overlap and the second surface of the first substrate faces the first surface of the second substrate;
a hole extending in a thickness direction through the plate-shaped body from a first opening in the first surface of the first substrate to a second opening in the second surface of the second substrate;
wherein a ratio A/B of an average thickness A of the first substrate to an average thickness B of the second substrate is ⅕ or less;
an interface between the second surface of the first substrate and the first surface of the second substrate positioned in the hole, the hole having a uniform diameter at the interface;
a covering layer positioned to cover the interface in the hole;
wherein the covering layer is made of the second material.

3. The composite substrate according to claim 1, wherein the covering layer is positioned to surround the interface.

4. The composite substrate according to claim 1, wherein the covering layer is positioned at 90% or greater of a thickness from the interface to an opening of the first substrate on an inner wall of the first substrate that is positioned at the hole.

5. The composite substrate according to claim 1, wherein the covering layer includes a part with a thickness that gradually increases from a side of an opening of the first substrate to a side of the interface.

6. The composite substrate according to claim 1, wherein the covering layer includes a part with a thickness that gradually increases from a side of an opening of the second substrate to a side of the interface.

7. The composite substrate according to claim 1, wherein the hole is provided in such a manner that a size of an opening of the first substrate is greater than a size of an opening of the second substrate.

8. The composite substrate according to claim 2, wherein the covering layer is positioned to surround the interface.

9. The composite substrate according to claim 2, wherein the covering layer is positioned at 90% or greater of a thickness from the interface to the first opening in the first surface of the first substrate.

10. The composite substrate according to claim 2, wherein the covering layer includes a part with a thickness that gradually increases from a side of the first opening in the first surface of the first substrate to a side of the interface.

11. The composite substrate according to claim 2, wherein the covering layer includes a part with a thickness that gradually increases from a side of the second opening in the second surface of the second substrate to a side of the interface.

12. The composite substrate according to claim 2, wherein a size of the first opening in the first surface of the first substrate is greater than a size of the second opening in the second surface of the second substrate.

13. The composite substrate according to claim 2, wherein a surface roughness of an inner wall of the first substrate is greater than a surface roughness of an inner wall of the second substrate.

* * * * *